United States Patent [19]

Ishige

[11] Patent Number: 5,648,285

[45] Date of Patent: Jul. 15, 1997

[54] METHOD FOR MANUFACTURING SEMICONDUCTOR NONVOLATILE MEMORY DEVICE WITH FIELD INSULATING LAYER

[75] Inventor: Kiyokazu Ishige, Tokyo, Japan

[73] Assignee: NEC Corporation, Tokyo, Japan

[21] Appl. No.: 533,966

[22] Filed: Sep. 26, 1995

[30] Foreign Application Priority Data

Sep. 26, 1994 [JP] Japan .................................. 6-229921

[51] Int. Cl.$^6$ .............................................. H01L 21/8247
[52] U.S. Cl. ..................... 437/43; 437/70; 148/DIG. 157
[58] Field of Search ................................ 437/38, 43, 45, 437/69, 70, 984; 148/DIG. 157

[56] References Cited

U.S. PATENT DOCUMENTS 5,019,527  5/1991  Ohshima et al. ........................ 437/43
5,273,926  12/1993  Tigelaar .................................. 437/43
5,480,819  1/1996  Huang .................................... 437/43

FOREIGN PATENT DOCUMENTS 3-211775  9/1991  Japan .

Primary Examiner—Chandra Chaudhari
Attorney, Agent, or Firm—Foley & Lardner

[57] ABSTRACT

In a method for manufacturing a semiconductor memory device including a plurality of field areas, a plurality of electrode areas, a plurality of source areas and drain areas surrounded by the field areas and the electrode areas, before forming field insulating layers for isolating the source and drain regions, impurities are introduced into the field areas between the source regions, to create an additional source region below the field insulating layer for isolating the source regions. The additional source regions are linked between the source regions.

6 Claims, 19 Drawing Sheets

Fig. 4A
PRIOR ART
Fig. 4C
PRIOR ART
Fig. 4B
PRIOR ART
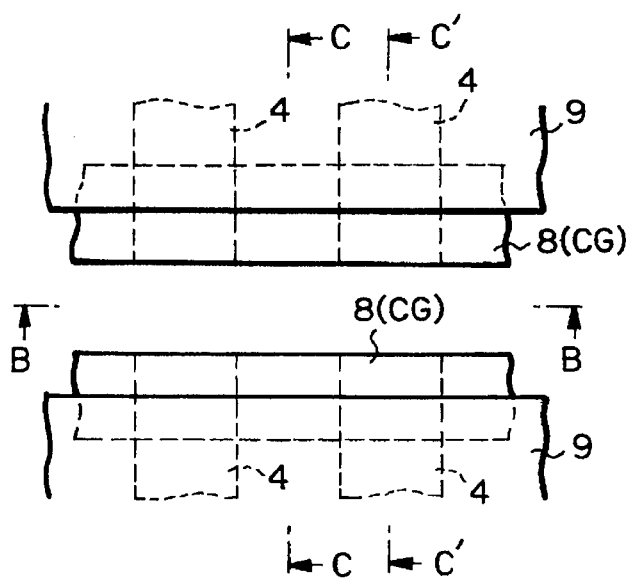
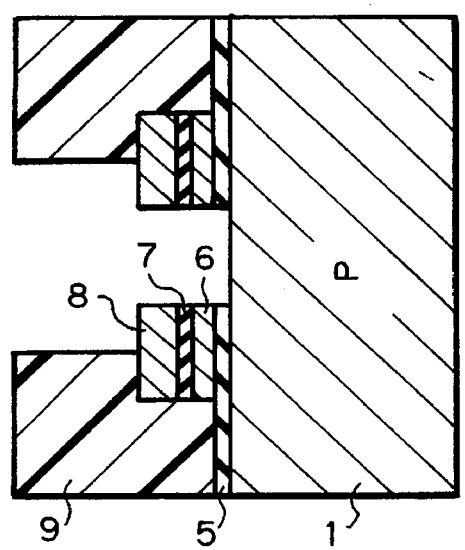
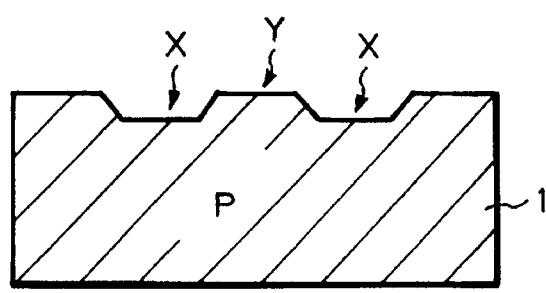

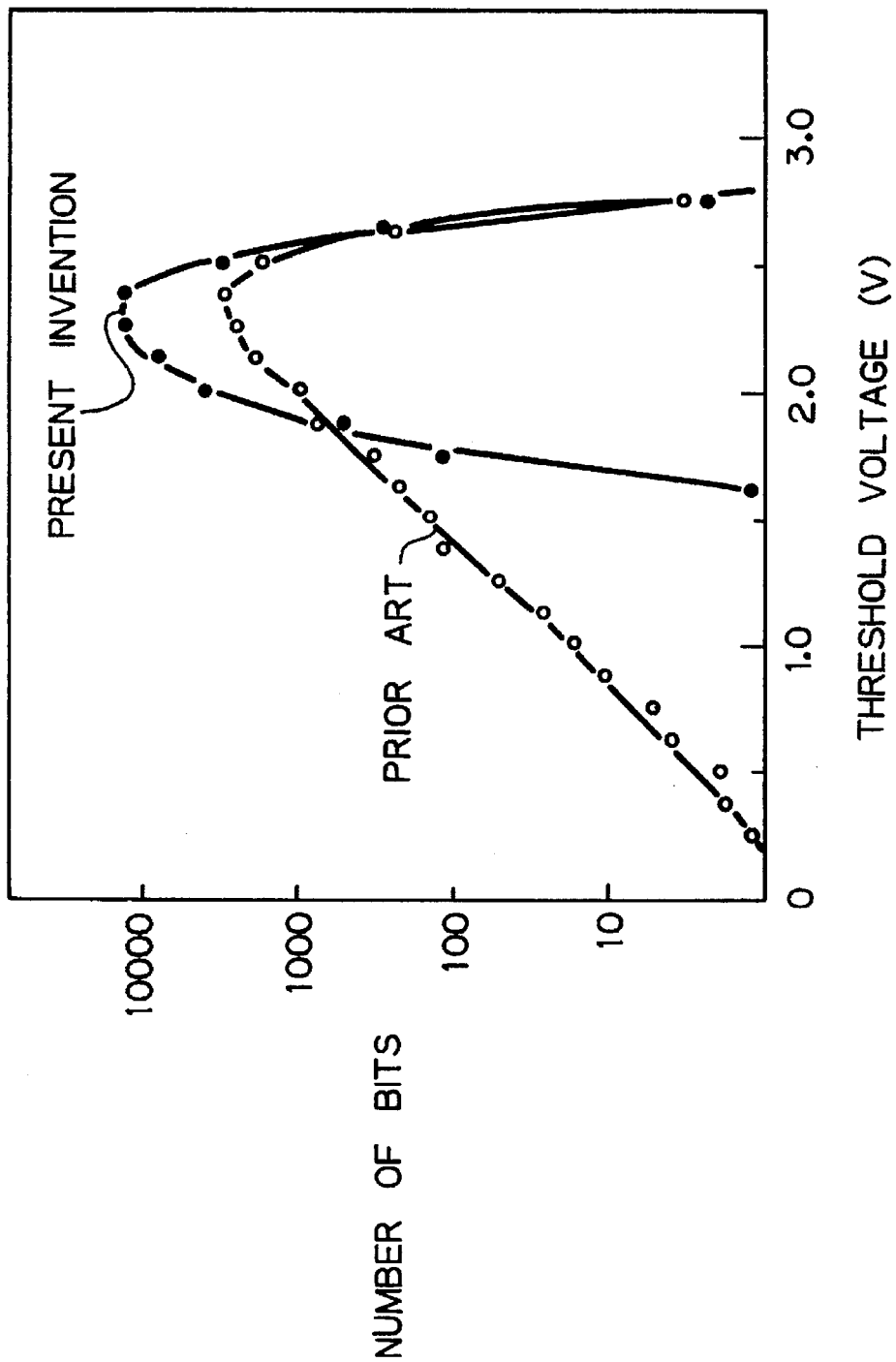

METHOD FOR MANUFACTURING SEMICONDUCTOR NONVOLATILE MEMORY DEVICE WITH FIELD INSULATING LAYER

BACKGROUND OF THE INVENTION

1. Field of the Invention

The present invention relates to a method for manufacturing a nonvolatile semiconductor memory device such as a NOR—type electrically erasable and programmable readonly memory (EEPROM).

2. Description of the Related Art

Generally, an EEPROM cell includes a P-type semiconductor substrate having an $N^+$-type source region, an $N^+$-type drain region, a floating gate electrode via a first gate insulating layer, and a control gate electrode via a second insulating layer on the floating gate electrode.

In a NOR-type nonvolatile semiconductor memory device by using the above-described EEPROM cells, a plurality of word lines, a plurality of bit lines, and a plurality of source lines are provided, and each of the EEPROM cells has a control gate electrode connected to one of the word lines, a source connected to one of the source lines, and a drain connected to one of the bit lines. For example, the source lines are connected to a source circuit. Therefore, a plurality of the source regions are usually electrically connected to each other.

In a prior art method for manufacturing a NOR-type semiconductor memory device (see JP-A-HEI 3-211775), a plurality of field areas in parallel with each other along a first direction, a plurality of electrode areas in parallel with each other along a second direction approximately perpendicular to the first direction, a plurality of source areas surrounded by the field areas and the electrode areas, and a plurality of drain areas surrounded by the field areas and the electrode areas are provided in a semiconductor substrate. In this case, the source areas and the drain areas are alternately arranged with respect to the electrode areas. First, a plurality of thick insulating layers, so called field insulating layers, are formed in the field areas. Then, electrodes each formed by a floating gate electrode and a control gate electrode are formed in the electrode areas. Then, only the thick insulating layers between the source areas are etched. Finally, impurities are introduced not only into the source reas and the drain areas but also into the field areas between the source regions. As a result, all the source regions are electrically connected to each other. This will be explained later in detail.

In the above-described prior art method, however, the source areas of the semiconductor substrate are overetched simultaneously with etching of the field insulating layers therebetween. As a result, the source areas of the semiconductor substrate are damaged which invites a deterioration of characteristics.

SUMMARY OF THE INVENTION

It is an object of the present invention to improve the characteristics of semiconductor memory devices.

According to the present invention, in a method for manufacturing a semiconductor memory device including a plurality of field areas, a plurality of electrode areas, a plurality of source areas and drain areas sunrounded by the field areas and the electrode areas, before forming field insulating layers for isolating the source and drain regions, impurities are introduced into the field areas between the source regions, to create an additional source region below the field insulating layer for isolating the source regions. The additional source regions are linked between the source regions.Thus, since the etching of the field insulating layers is unnecessary, the source regions are not damaged.

BRIEF DESCRIPTION OF THE DRAWINGS

The present invention will be more clearly understood from the description as set forth below, in comparison with the prior art, with reference to the accompanying drawings, wherein:

FIGS. 2A, 3A, 4A, 5A and 6A are plan views illustrating a prior art method for manufacturing a NOR-type nonvolatile semiconductor memory device;

FIGS. 4B, 4C and 4D are cross-sectional views taken along the lines B—B, C—C and C'—C' in FIG. 4A;

FIGS. 17 is a graph showing the threshold voltage characteristics of a semiconductor memory device according to the present invention.

DESCRIPTION OF THE PREFERRED EMBODIMENT

Before the description of the preferred embodiments, a prior art method for manufacturing a NOR-type nonvolatile semiconductor memory device will be explained with reference to FIGS. 1, 2A, 2B, 2C, 3A, 3B, 3C, 4A, 4B, 4C, 4D, 5A, 5B, 5C, 6A, 6B and 6C.

Figure 1:
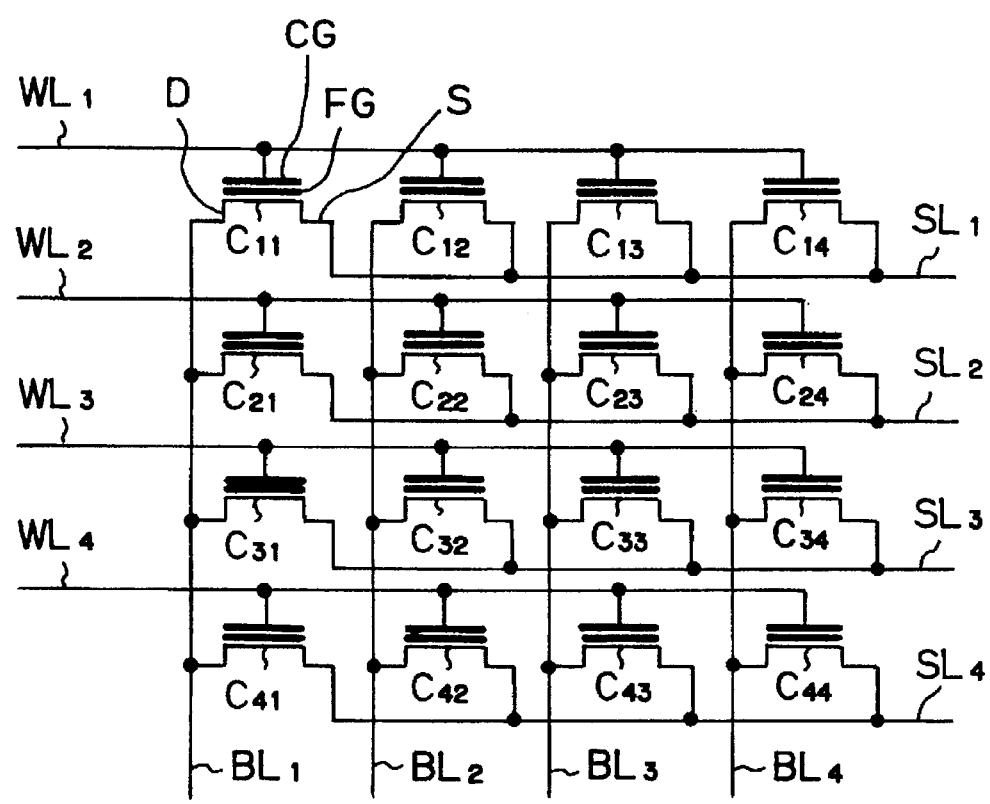
FIG. 1 is a circuit diagram illustrating a prior art NOR-type nonvolatile semiconductor memory device.

In FIG. 1, which illustrates a prior art NOR-type nonvolatile semiconductor memory device, four word lines $WL_1$, $WL_2$, $WL_3$ and $WL_4$, four bit lines $BL_1$, $BL_2$, $BL_3$ and $BL_4$ are provided. Also, memory cells $C_{11}$, $C_{12}$, ... ,$C_{44}$ are provided at intersections between the word lines $WL_1$, $WL_2$, $WL_3$ and $WL_4$, the bit lines $BL_1$, $BL_2$, $BL_3$ and $BL_4$, and the source lines $SL_1$, $SL_2$, $SL_3$ and $SL_4$. For example, memory cell $C_{11}$ has a floating gate FG, a control gate CG connected to the word line $WL_1$, a drain D connected to the bit line $BL_1$, and a soure S connected to the source line $SL_1$.

Also, usually, in an erase mode, all the voltages at the source lines $SL_1$, $SL_2$, $SL_3$ and $SL_4$ are at a high voltage $V_{PP}$ (=20 to 25 V), while in a non-erase mode, all the voltages at the source lines $SL_1$, $SL_2$, $SL_3$ and $SL_4$ are at a low voltage GND (=0 V).

Figure 2A:
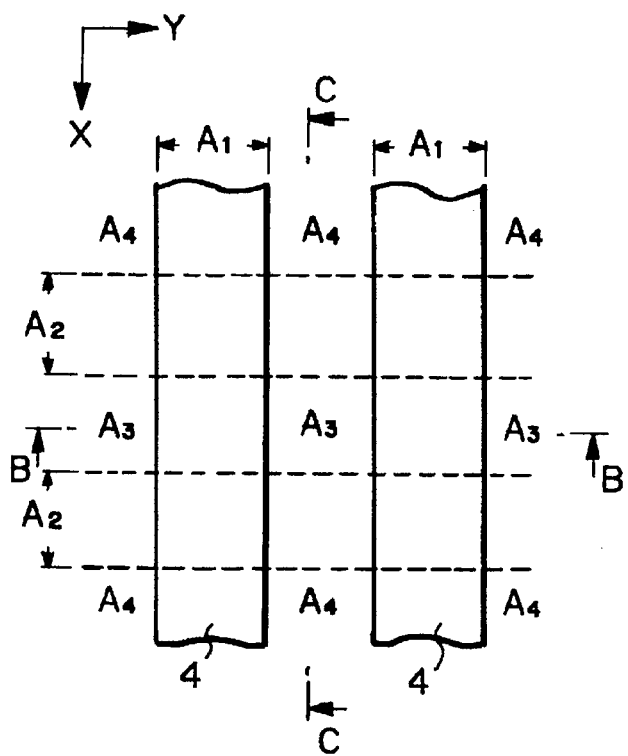

Also, in FIG. 2A, a monocrystalline silicon substrate 1 is divided into a plurality of field areas $A_1$ in parallel with each other along an X direction, a plurality of electrode areas $A_2$ in parallel with each other along a Y direction, a plurality of source areas $A_3$ surrounded by the field areas $A_1$ and the electrode areas $A_2$, and a plurality of drain areas $A_4$ surrounded by the field areas $A_1$ and the electrode areas $A_2$. In this case, the source areas $A_3$ and the drain areas $A_4$ are alternately arranged in the Y direction.

Figure 2C:
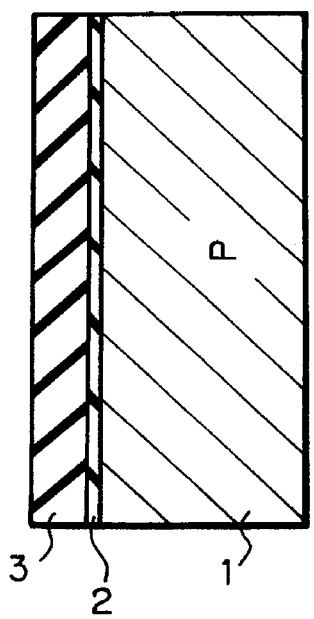
FIGS. 2B and 2C are cross-sectional views taken along the lines B—B and C—C in FIG. 2A.
Figure 2B:
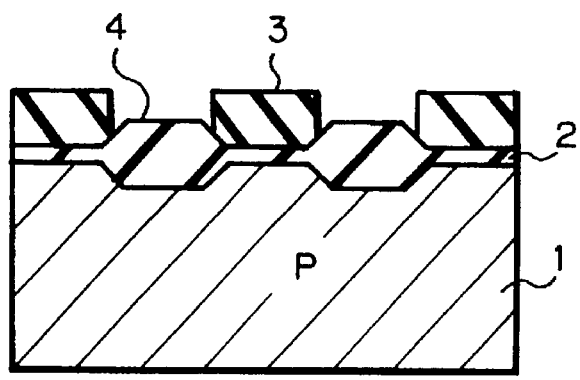

First, referring to FIGS. 2A, 2B and 2C, a silicon oxide layer 2 is formed by thermally oxidizing the silicon substrate 1. Also, a silicon nitride layer 3 is formed by a chemical vapor deposition (CVD) process, and the silicon nitride layer 3 is patterned by a photolithography process. That is, the field areas $A_1$ of the silicon nitride layer 3 are perforated. Then, a heating operation is carried out under an oxygen atmosphere, to create a thick field silicon layer 4. This is called a local oxidation of silicon (LOCOS). Then, the silicon nitride layer 3 and the exposed silicon oxide layer 2 are removed.

Figure 3A:
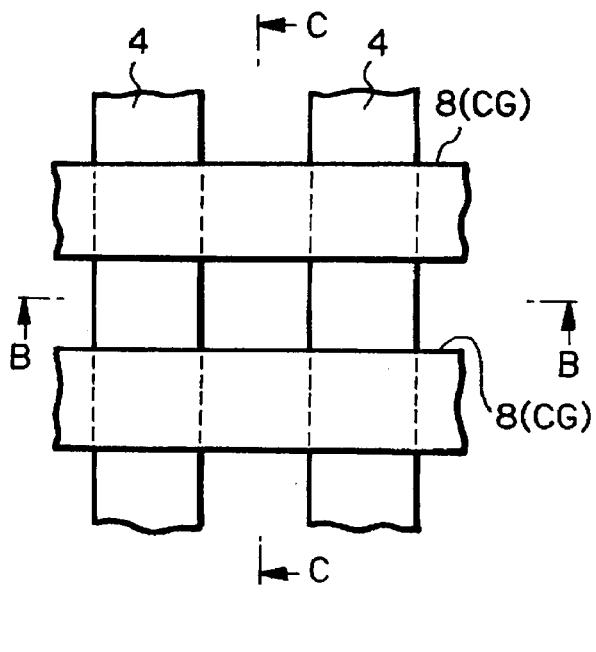
Figure 3C:
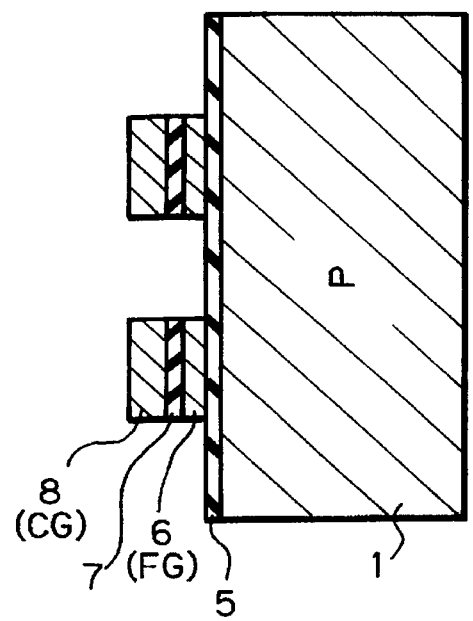
FIGS. 3B and 3C are cross-sectional views taken along the lines B—B and C—C in FIG. 3A.
Figure 3B:
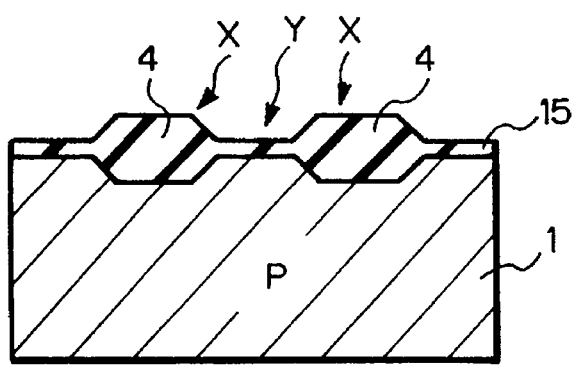
Figure 4D:
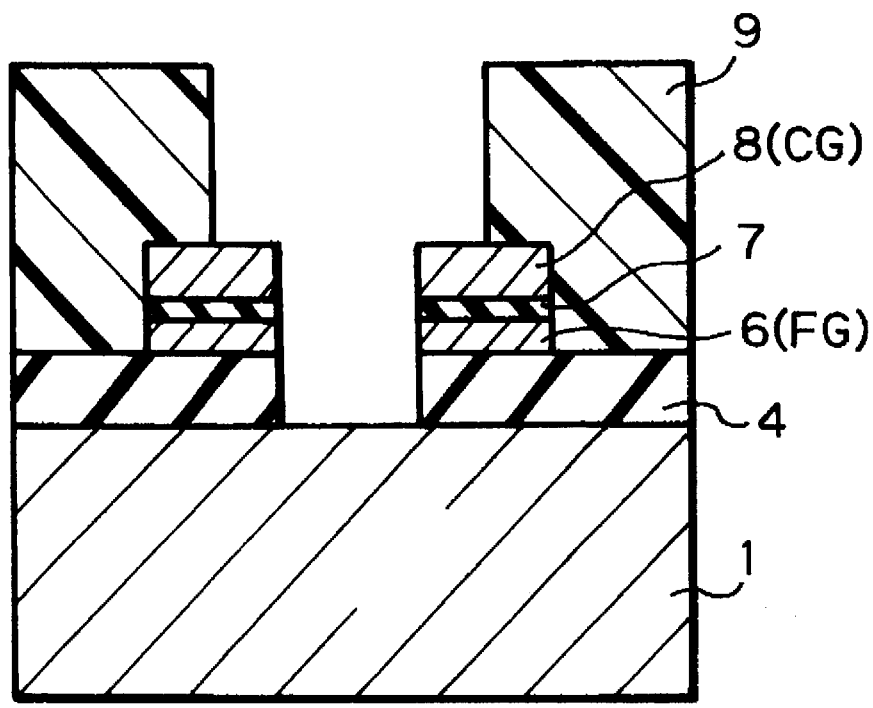

Next, referring to FIGS. 3A, 3B and 3C, the silicon subtrate 1 is thermally oxidized to grow an about 50 to 150 Å thick gate silicon oxide layer 5, and then, an about 1000 to 3000 Å thick phosphorus including polycrystalline silicon layer 6 is deposited on the silicon oxide layer 5 by a CVD process. Also, the polycrystalline silicon layer 6 is thermally oxidized to grow an about 100 to 300 Å thick gate silicon oxide layer 7, and then, a phosphorus including polycrystalline silicon layer 8 is deposited on the silicon oxide layer 7 by a CVD process. Then, the polycrystalline silicon layer 8, the silicon oxide layer 7 and the polycrystalline silicon layer 6 are patterned by a photolithography and etching process to form control gate electrodes CG and floating gate electrodes FG. Note that the control gates CG are connected to the word lines $WL_1$, $WL_2$, $WL_3$ and $WL_4$ of FIG. 1.

Next, referring to FIGS. 4A, 4B, 4C and 4D, a photoresist pattern 9 is formed to cover at least the drain areas $A_4$. Then, the field silicon oxide layer 4 and the gate silicon oxide layer 5 are etched with a mask of the photoresist pattern 9 and the control gate electrodes 8 (CG). As a result, only the field silicon oxide layer 5 sandwiched by the source areas $A_3$ is removed. Then, the photoresist pattern 9 is removed.

Figure 5A:
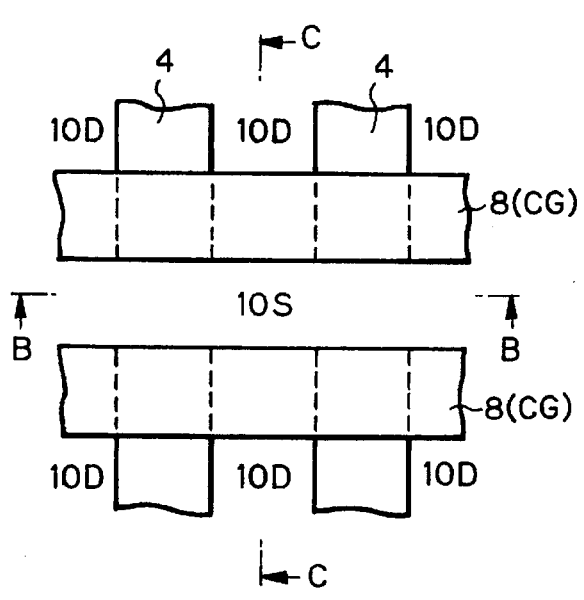
Figure 5C:
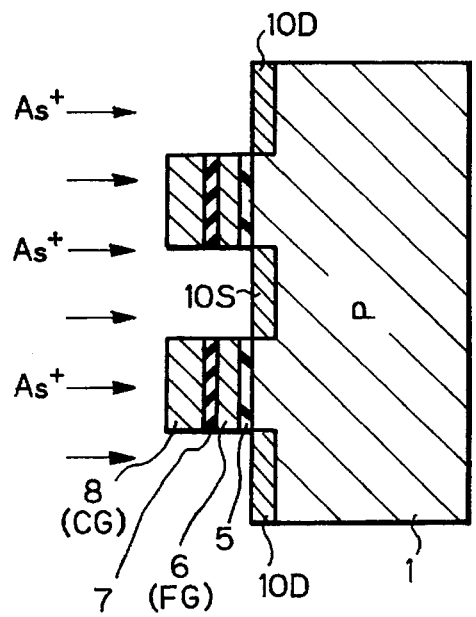
FIGS. 5B and 5C are cross-sectional views taken along the lines B—B and C—C in FIG. 5A.
Figure 5B:
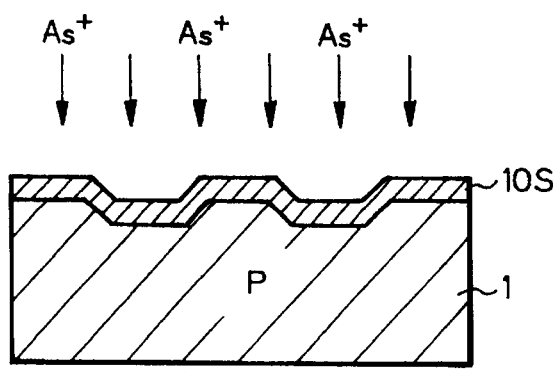

Next, referring to FIGS. 5A, 5B and 5C, impurity ions such as arsenic ions are implanted into the silicon substrate 1 with a mask of the control gate electrodes 8 (CG) and the field silicon oxide layers 4. As a result, source regions 10S are formed in the source areas $A_3$ of the silicon substrate 1, and drain regions 10D are formed in the drain areas $A_4$ of the silicon substrate 1.

Figure 6A:
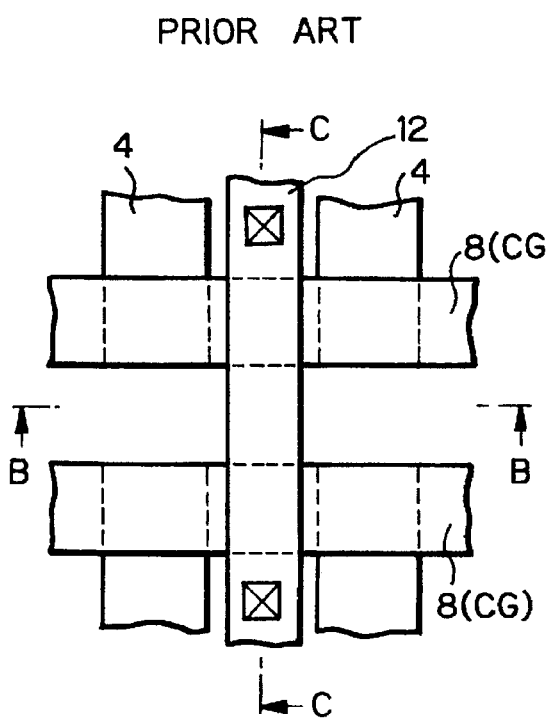
Figure 6C:
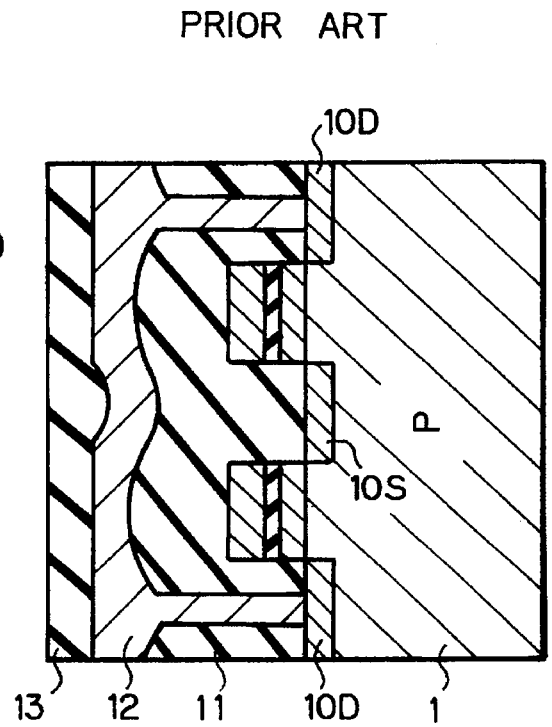
FIGS. 6B and 6C are cross-sectional views taken along the lines B—B and C—C in FIG. 6A.
Figure 6B:
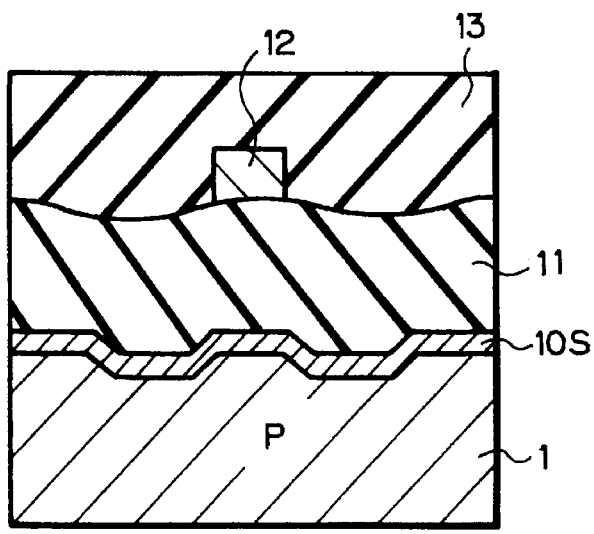
Figure 7A:
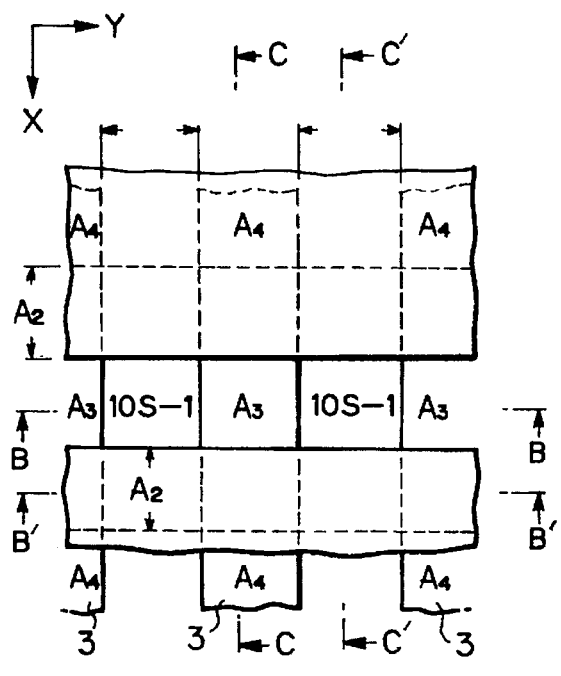
FIG. 7A, 8A, 9A, 10A and 11A are plan views illustrating a first embodiment of the method for manufacturing a NOR-type nonvolatile semiconductor memory device according to the present invention.
Figure 7C:
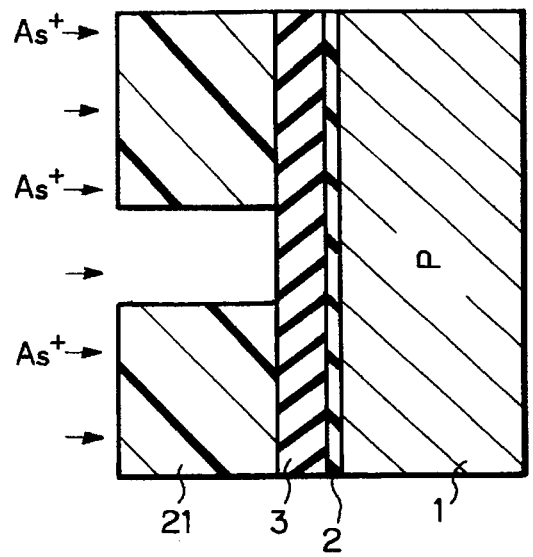
FIGS. 7B, 7C and 7D are cross-sectional views taken along the lines B—B, C—C and C'—C' in FIG. 7A.
Figure 7B:
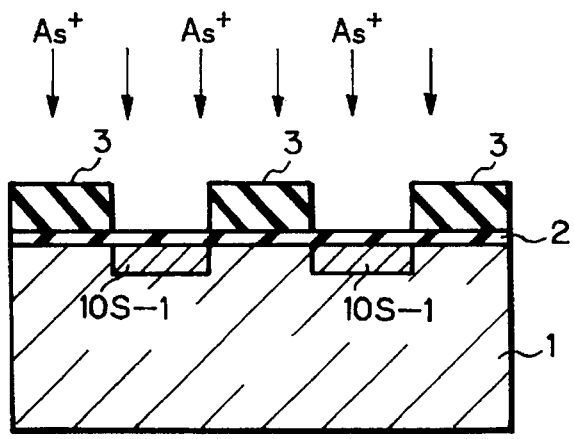
Figure 7D:
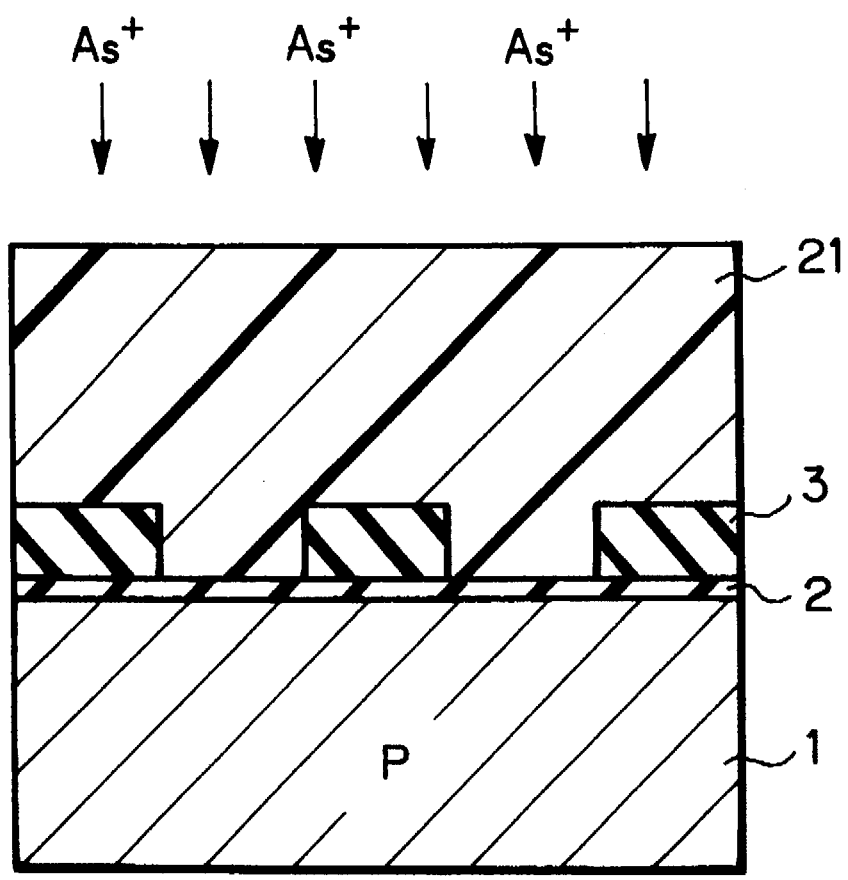

Finally, referring to FIGS. 6A, 6B and 6C, an insulating layer 11 is formed, and an aluminum wiring layer 12 which serves as the bit lines $BL_1$, $BL_2$, $BL_3$ and $BL_4$ of FIG. 1 is formed. Further, a cover insulating layer 13 is formed, thus completing a NOR-type nonvolatile semiconductor memory device.

The above-described prior art method is disclosed in JP-A-HEI3-211775, for example.

In the prior art method, when the field silicon oxide layers 4 are etched as indicated by X in FIGS. 3B and 4B, the silicon oxide layer 5 is also etched as indicated by Y in FIGS. 3B and 4B. In this case, the silicon substrate 1 indicated by Y may be overetched, and accordingly, the silicon substrate 1 is damaged, which invites a deterioration of characteristics such as threshold voltage characteristics.

A first embodiment of the present invention is explained next with reference to FIGS. 7A, 7B, 7C, 7D, 8A, 8B, 8C, 9A, 9B, 9C, 10A, 10B, 10C, 11A, 11B and 11C.

First, referring to FIGS. 7A, 7B, 7C and 7D, a silicon oxide layer 2 is formed by thermally oxidizing the silicon substrate 1. Also, a silicon nitride layer 3 is formed by a CVD process, and the silicon nitride layer 3 is patterned by a photolithography process. That is, the field areas $A_1$ of the silicon nitride layer 3 are perforated. Then, a photoresist pattern 21 is formed by a photolithography process to cover at least the field areas $A_1$ sandwiched by the drain areas $A_4$. Then, impurity ions such as arsenic ions are implanted into the silicon substrate 1 with a mask of the silicon nitride layer 3 and the photoresist pattern 21. As a result, source regions 10S-1 are formed in the silicon substrate 1 surrounded by the source areas $A_3$. Then, the photoresist pattern 21 is removed.

Figure 8A:
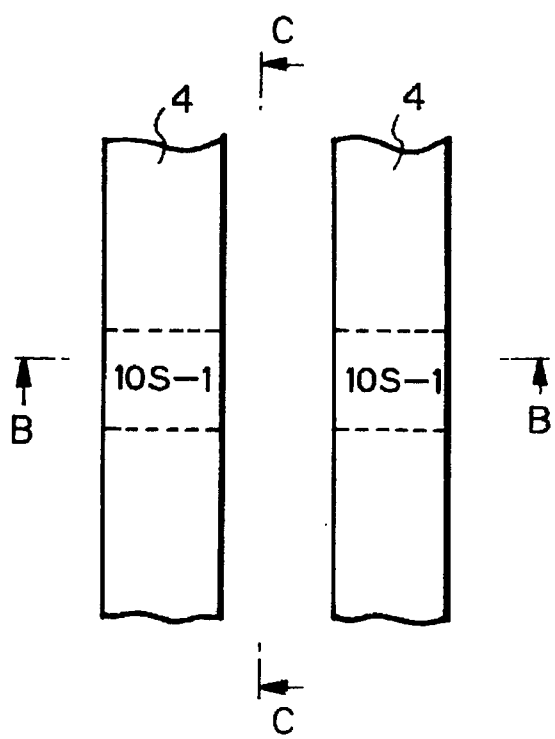
Figure 8C:
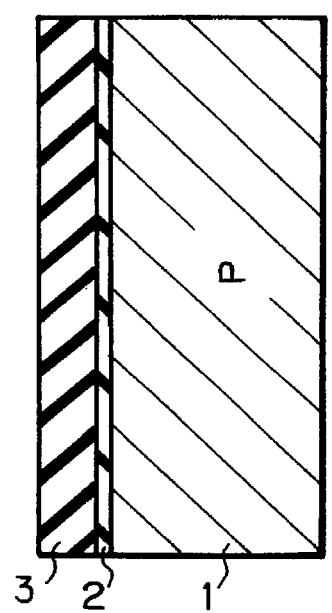
FIGS. 8B and 8C are cross-sectional views taken along the lines B—B and C—C in FIG. 8A.
Figure 8B:
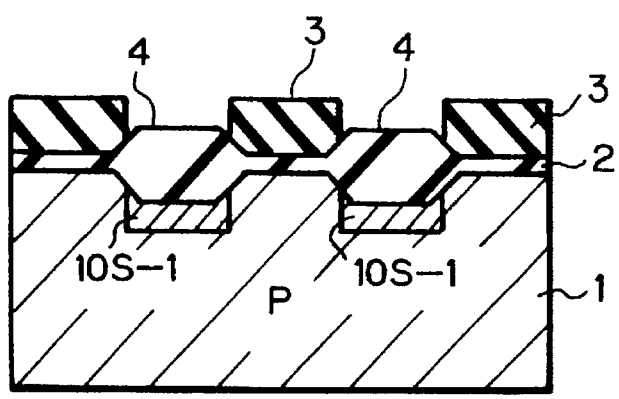

Next, referring to FIGS. 8A, 8B and 8C, a heating operation is carried out under an oxygen atmosphere, to create a thick field silicon layer 4. This is called LOCOS. Then, the silicon nitride layer 3 and the exposed silicon oxide layer 2 are removed.

Figure 9A:
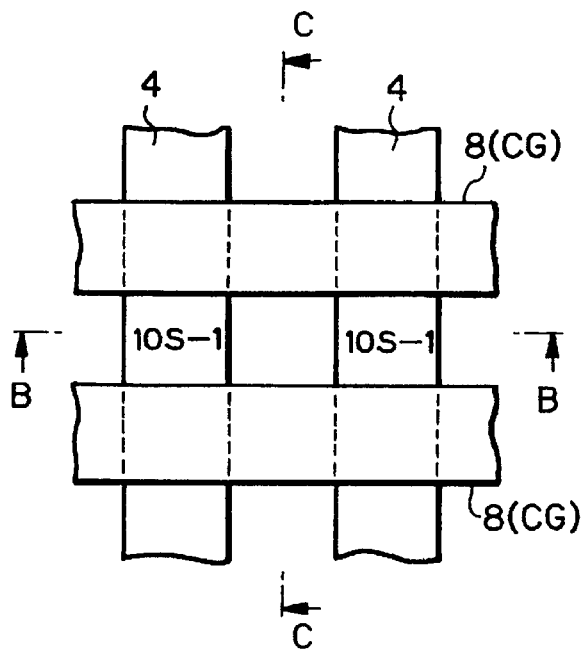
Figure 9C:
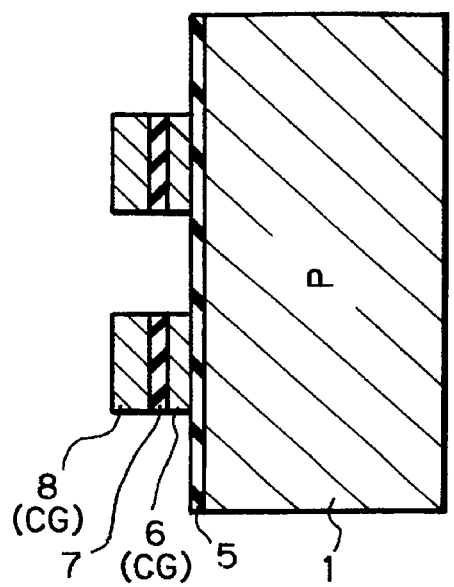
FIGS. 9B and 9C are cross-sectional views taken along the lines B—B and C—C in FIG. 9A.
Figure 9B:
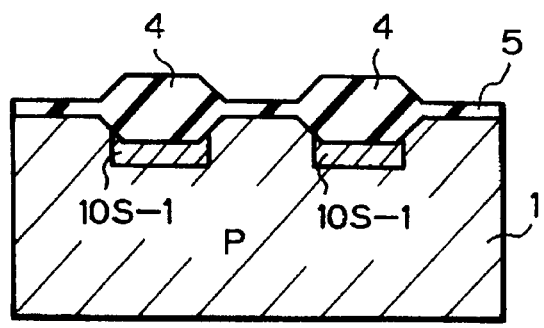

Next, referring to FIG. 9A, 9B and 9C, in the same way as in FIGS. 3A, 3B and 3C, the silicon subtrate 1 is thermally oxidized to grow an about 50 to 150 Å thick gate silicon oxide layer 5, and then, an about 1000 to 3000 Å thick phosphorus including polycrystalline silicon layer 6 is deposited on the silicon oxide layer 5 by a CVD process. Also, the polycrystalline silicon layer 6 is thermally oxidized to grow an about 100 to 300 Å thick gate silicon oxide layer 7, and then, a phosphorus including polycrystalline silicon layer 8 is deposited on the silicon oxide layer 7 by a CVD process. Then, the polycrystalline silicon layer 8, the silicon oxide layer 7 and the polycrystalline silicon layer 6 are patterned by a photolithography and etching process to form control gate electrodes CG and floating gate electrodes FG. Note that the control gates CG are connected to the word lines $WL_1$, $WL_2$, $WL_3$ and $WL_4$ of FIG. 1.

Figure 10A:
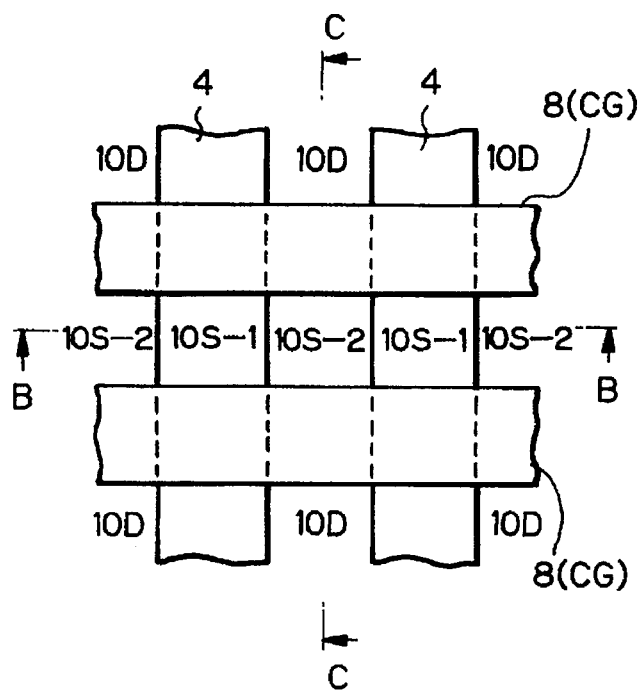
Figure 10C:
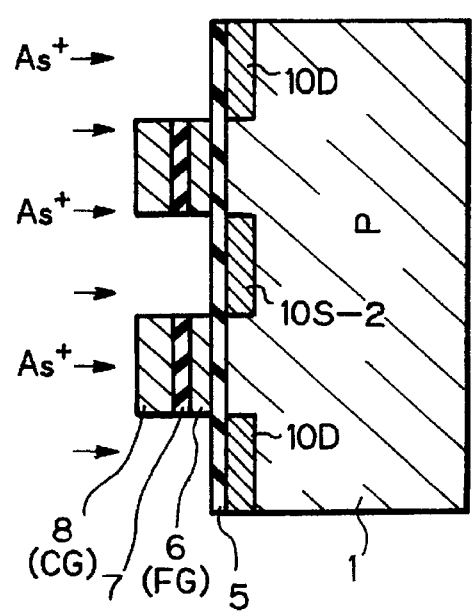
FIGS. 10B and 10C are cross-sectional views taken along the lines B—B and C—C in FIG. 10A.
Figure 10B:
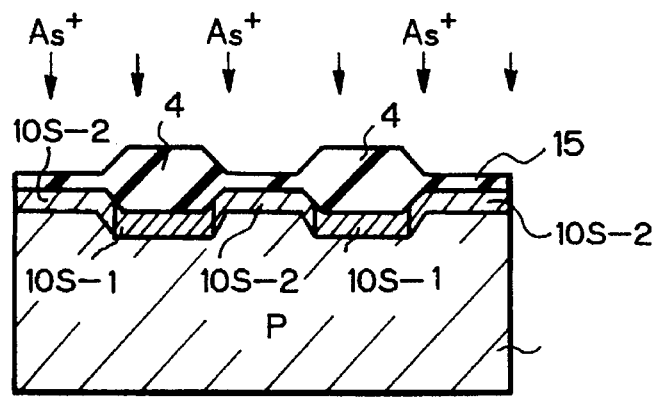

Next, referring to FIG. 10A, 10B and 10C, in the same way as in FIGS. 5A, 5B and 5C, impurity ions such as arsenic ions are implanted into the silicon substrate 1 with a mask of the control gate electrodes 8 (CG) and the field silicon oxide layers 4. As a result, source regions 10S-2 are formed in the source areas $A_3$ of the silicon substrate 1, and drain regions 10D are formed in the drain areas $A_4$ of the silicon substrate 1.

Figure 11A:
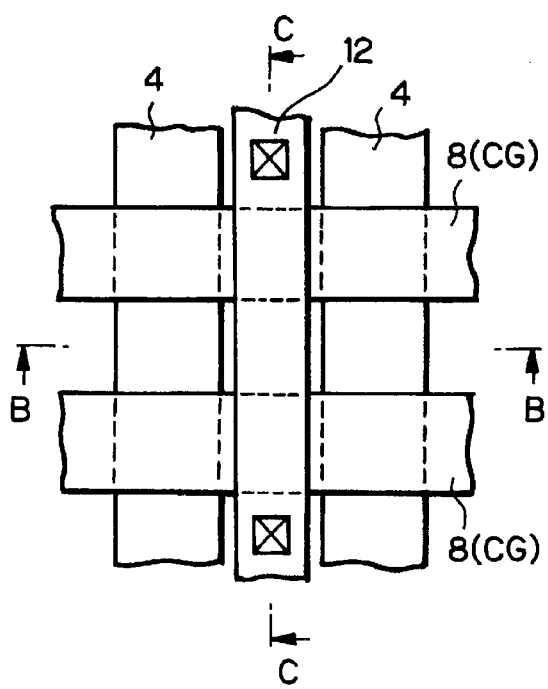
Figure 11C:
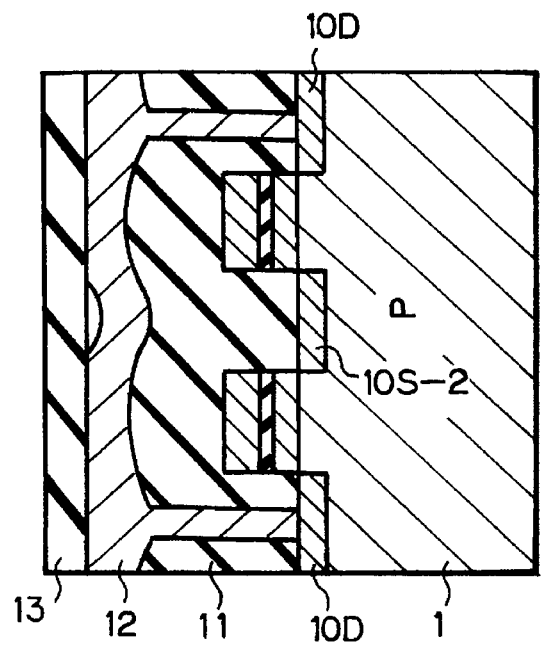
FIGS. 11B and 11C are cross-sectional views taken along the lines B—B and C—C in FIG. 11A.
Figure 11B:
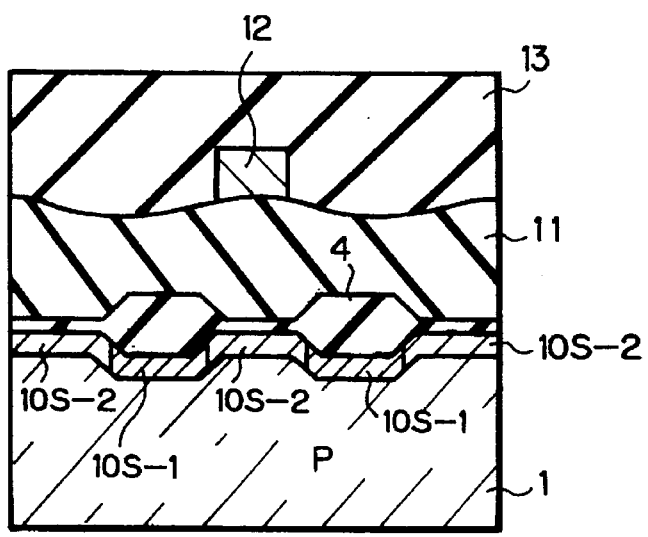

Finally, referring to FIG. 11A, 11B and 11C, in the same way as in FIGS. 6A, 6B and 6C, an insulating layer 11 is formed, and an aluminum wiring layer 12 which serving as the bit lines $BL_1$, $BL_2$, $BL_3$ and $BL_4$ of FIG. 1 is formed. Further, a cover insulating layer 13 is formed, thus completing a NOR-type nonvolatile semiconductor memory device.

A second embodiment of the present invention is explained next with reference to FIGS. 12A, 12B, 12C, 13A, 13B, 13C, 14A, 14B, 14C, 15A, 15B, 15C, 16A, 16B and 16C.

Figure 12A:
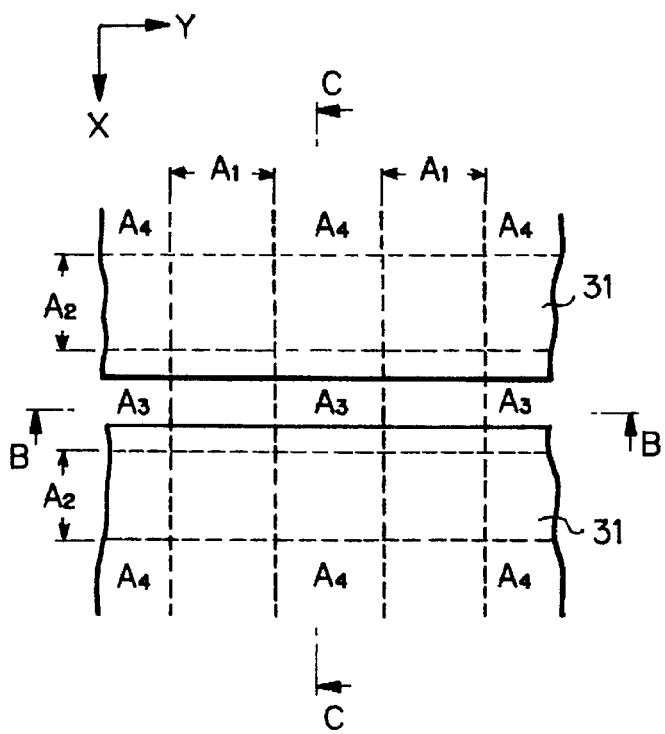
FIGS. 12A, 13A, 14A, 15A and 16A are plan views illustrating a second embodiment of the method for manufacturing a NOR-type nonvolatile semiconductor memory device according to the present invention.
Figure 12C:
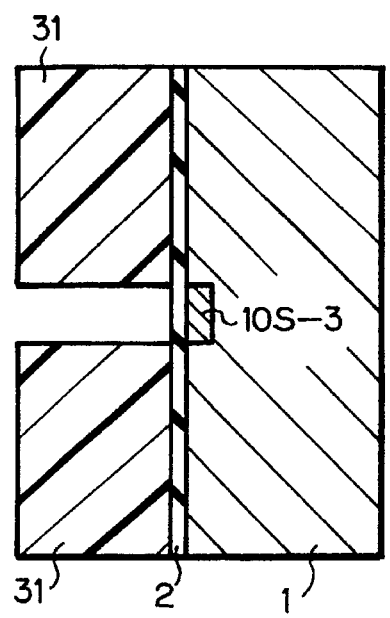
FIGS. 12B and 12C are cross-sectional views taken along the lines B—B and C—C in FIG. 12A.
Figure 12B:
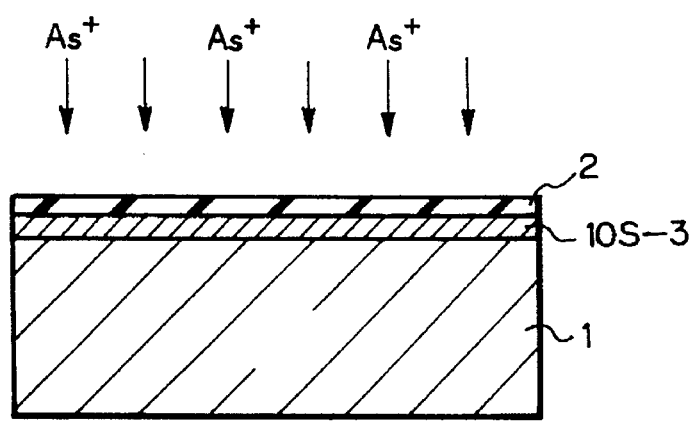

First, referring to FIGS. 12A, 12B and 12C, a silicon oxide layer 2 is formed by thermally oxidizing the silicon substrate 1. Then, a photoresist pattern 31 is formed. That is, the photoresist pattern 31 has openings defining a part of the field areas $A_1$ surrounded by the source areas $A_3$ and a part of the source areas $A_3$. Then, impurity ions such as arsenic ions are implanted into the silicon substrate 1 with a mask of the photoresist pattern 31. As a result, source regions 10S-3 are formed in the silicon substrate 1 extending over the source areas $A_3$. Then, the photoresist pattern 31 is removed.

Figure 13A:
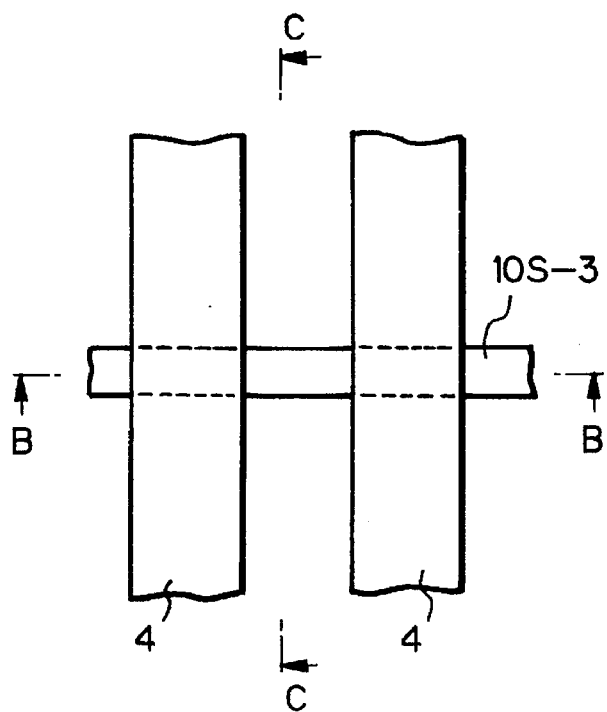
Figure 13C:
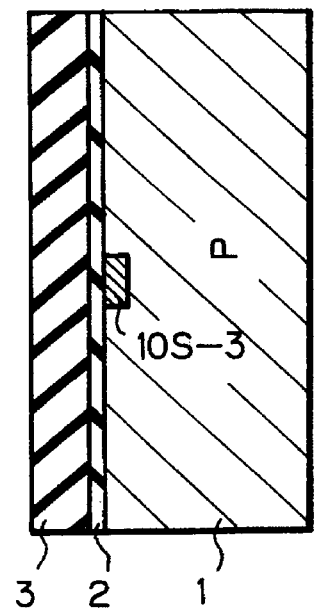
FIGS. 13B and 13C are cross-sectional views taken along the lines B—B and C—C in FIG. 13A.
Figure 13B:
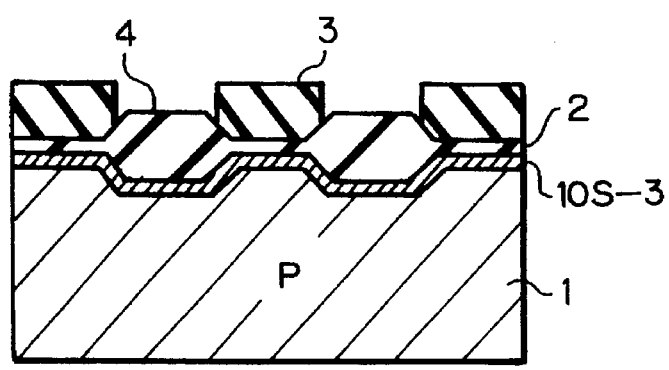

Next, referring to FIGS. 13A, 13B and 13C, in a similar way to that as shown in FIGS. 2A, 2B and 2C, a silicon nitride layer 3 is formed by a CVD process, and the silicon nitride layer 3 is patterned by a photolithography process. That is, the field areas $A_1$ of the silicon nitride layer 3 are perforated. Then, a heat operation is carried out under an oxygen atmosphere, to create a thick field silicon layer 4. This is called LOGOS. Then, the silicon nitride layer 3 and the exposed silicon oxide layer 2 are removed.

Figure 14A:
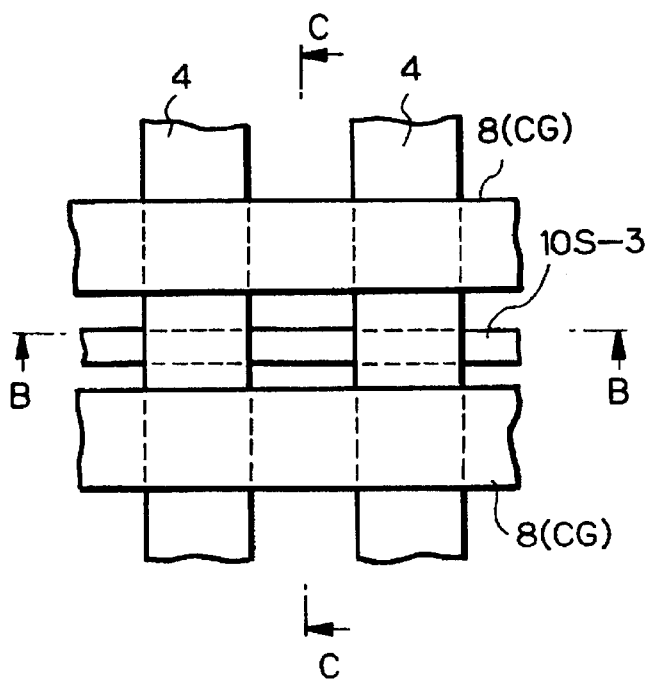
Figure 14C:
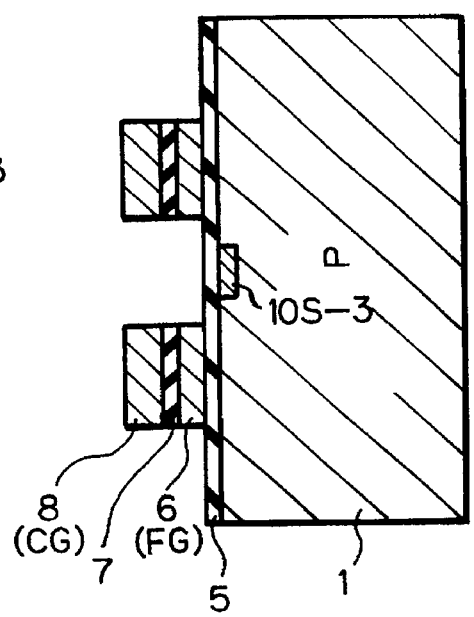
FIGS. 14B and 14C are cross-sectional views taken along the lines B—B and C—C in FIG. 14A.
Figure 14B:
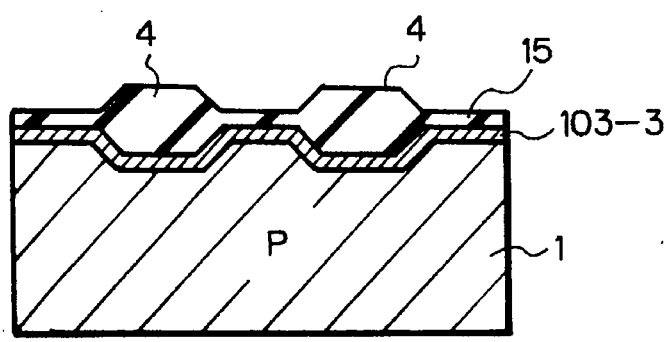

Next, referring to FIG. 14A, 14B and 14C, in the same way as in FIGS. 3A, 3B and 3C, the silicon subtrate 1 is thermally oxidized to grow an about 50 to 150 Å thick gate silicon oxide layer 5, and then, an about 1000 to 3000 Å thick phosphorus including polycrystalline silicon layer 6 is deposited on the silicon oxide layer 5 by a CVD process. Also, the polycrystalline silicon layer 6 is thermally oxidized to grow an about 100 to 300 Å thick gate silicon oxide layer 7, and then, a phosphorus including polycrystalline silicon layer 8 is deposited on the silicon oxide layer 7 by a CVD process. Then, the polycrystalline silicon layer 8, the silicon oxide layer 7 and the polycrystalline silicon layer 6 are patterned by a photolithography and etching process to form control gate electrodes CG and floating gate electrodes FG. Note that the control gates CG are connected to the word lines $WL_1$, $WL_2$, $WL_3$ and $WL_4$ of FIG. 1.

Figure 15A:
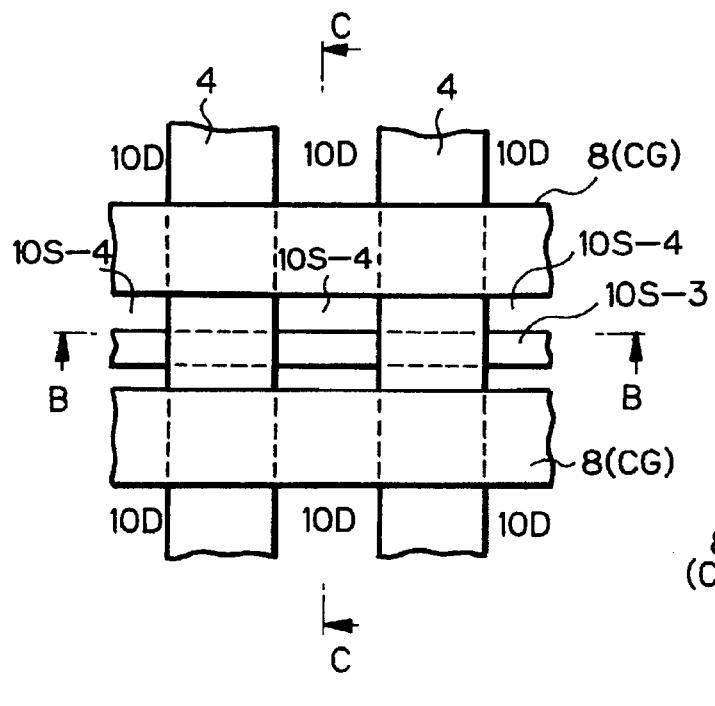
Figure 15C:
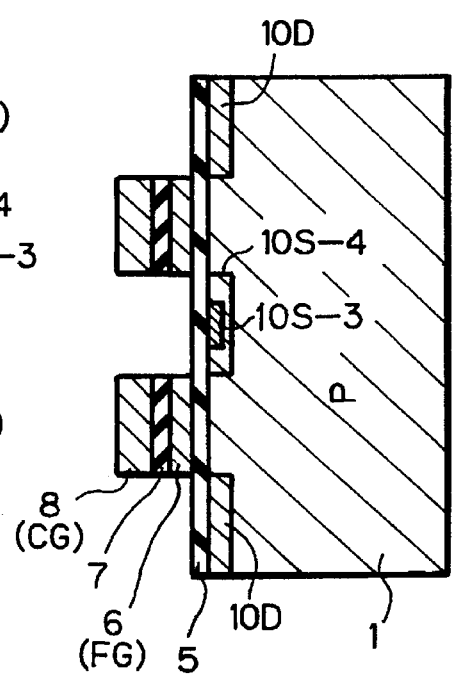
FIGS. 15B and 15C are cross-sectional views taken along the lines B—B and C—C in FIG. 15A.
Figure 15B:
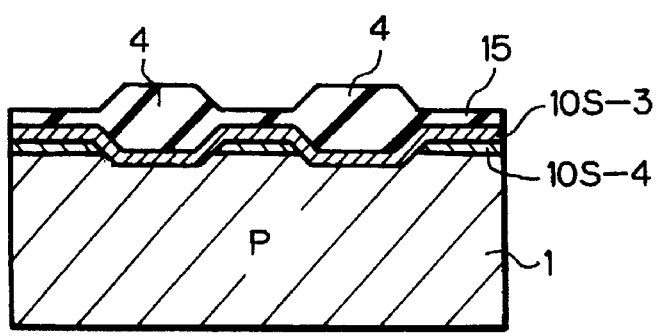

Next, referring to FIG. 15A, 15B and 15C, in the same way as in FIGS. 5A, 5B and 5C, impurity ions such as arsenic ions are implanted into the silicon substrate 1 with a mask of the control gate electrodes 8 (CG) and the field silicon oxide layers 4. As a result, source regions 10S-4 are formed in the source areas $A_3$ of the silicon substrate 1, and drain regions 10D are formed in the drain areas $A_4$ of the silicon substrate 1.

Figure 16A:
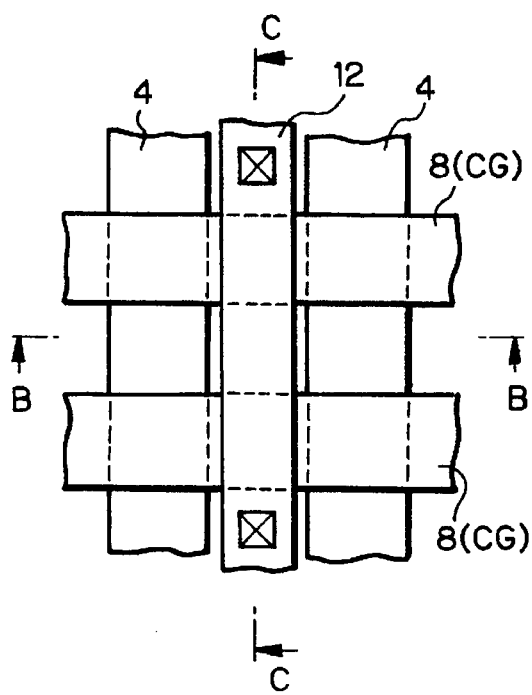
Figure 16C:
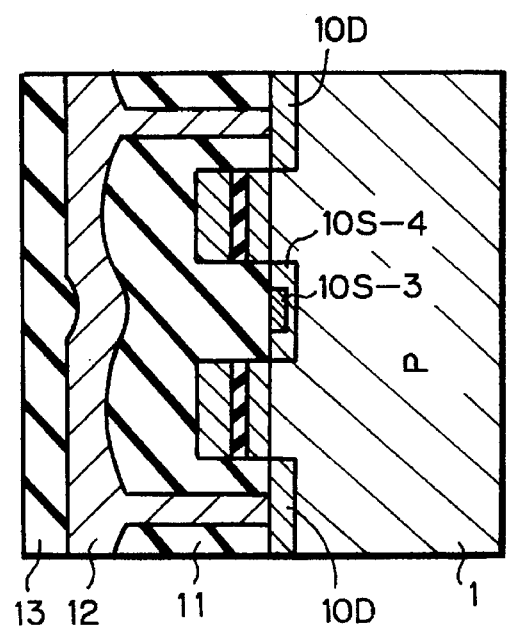
FIGS. 16B and 16C are cross-sectional views taken along the lines B—B and C—C in FIG. 16A.
Figure 16B:
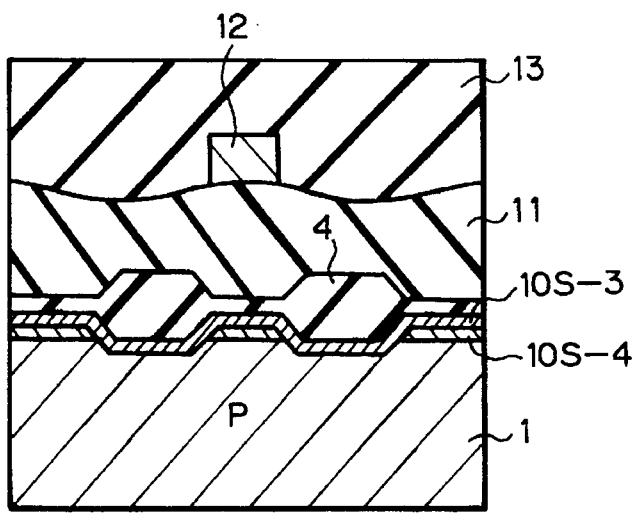

Finally, referring to FIG. 16A, 16B and 16C, in the same way as in FIGS. 6A, 6B and 6C, an insulating layer 11 is formed, and an aluminum wiring layer 12 which serves as the bit lines $BL_1$, $BL_2$, $BL_3$ and $BL_4$ of FIG. 1 is formed. Further, a cover insulating layer 13 is formed, thus completing a NOR-type nonvolatile semiconductor memory device.

In the above-described embodiments, the etching of the field silicon oxide layer is not carried out, so that the overetching of the silicon substrate, particularly, the source regions thereof hardly occurs.

According to the experiments conducted by the inventor, the distribution of threshold voltages after a flash erasing operation can be narrowed as shown in FIG. 17.

As explained hereinbefore, according to the present invention, since the damage of semiconductor substrates by etching field insulating layers is eliminated, the characteristics of semiconductor devices such as threshold voltage characteristics can be improved.

I claim:

1. A method for manufacturing a semiconductor memory device including a plurality of field areas in parallel with each other along a first direction, a plurality of electrode areas in parallel with each other along a second direction approximately perpendicular to said first direction, a plurality of source areas surrounded by said field areas and said electrode areas, and a plurality of drain areas surrounded by said field areas and said electrode areas, said source areas and said drain areas being alternately arranged with respect to said electrode areas, comprising the steps of:

a) preparing a semiconductor substrate of a first conductivity type;

b) introducing impurities of a second conductivity type opposite to said first conductivity type into said field areas of said semiconductor substrate sandwiched by said source areas;

c) forming a plurality of insulating layers in said field areas of said semiconductor substrate after step b);

d) forming an electrode layer in said electrode area of said semiconductor substrate after step c); and e) introducing impurities of said second conductivity type into said source areas and drain areas of said semiconductor substrate after step d).

2. A method as set forth in claim 1, wherein said step d) comprises the steps of:

forming a first gate insulating layer on said electrode area of said semiconductor substrate;

forming a floating gate electrode layer on said first gate insulating layer;

forming a second gate insulating layer on said floating gate electrode layer; and forming a control gate electrode layer on said second gate insulating layer.

3. A method for manufacturing a semiconductor memory device including a plurality of field areas in parallel with each other along a first direction, a plurality of electrode areas in parallel with each other along a second direction approximately perpendicular to said first direction, a plurality of source areas surrounded by said field areas and said electrode areas, and a plurality of drain areas surrounded by said field areas and said electrode areas, said source areas and said drain areas being alternately arranged with respect to said electrode areas, comprising the steps of:

a) preparing a semiconductor substrate of a first conductivity type;

b) introducing impurities of a second conductivity type opposite to said first conductivity type into a part of said field areas of said semiconductor substrate sandwiched by said source areas and a part of said source areas;

c) forming a plurality of insulating layers in said field areas of said semiconductor substrate after step b);

d) forming an electrode layer in said electrode area of said semiconductor substrate after step c); and e) introducing impurities of said second conductivity type into said source areas and drain areas of said semiconductor substrate after step d).

4. A method as set forth in claim 3, wherein said step d) comprises the steps of:

forming a first gate insulating layer on said electrode area of said semiconductor substrate;

forming a floating gate electrode layer on said first gate insulating layer;

forming a second gate insulating layer on said floating gate electrode layer; and forming a control gate electrode layer on said second gate insulating layer.

5. A method for manufacturing a nonvolatile semiconductor memory device, comprising the steps of:

forming a silicon nitride pattern on a silicon substrate of a first conductivity type, said silicon nitride pattern having openings defining field areas;

forming a resist pattern having an opening for a part of said field areas sandwiched by source areas;

introducing impurities of a second conductivity type into said silicon substrate with a mask of said resist pattern and said silicon nitride pattern to form first source regions in said silicon substrate;

removing said resist pattern after formation of said first source regions;

performing a heating operation under an oxygen atmosphere upon said silicon substrate with a mask of said silicon nitride pattern to generate a silicon oxide layer in said field areas;

removing said silicon nitride pattern;

forming a first gate insulating layer after removing said silicon nitride layer;

forming a first floating gate electrode layer on said first gate insulating;

forming a second gate insulating layer on said first floating electrode layer;

forming a control gate electrode layer on said second gate insulating layer;

patterning said control gate electrode layer, said second gate insulating layer and said floating gate electrode layer, to form floating gate electrodes and control gate electrodes; and introducing impurities of said second conductivity type into said silicon substrate with a mask of said silicon oxide layer and said control gates electrodes to form second source regions and drain regions, said second source regions being connected to said first source regions.

6. A method for manufacturing a nonvolatile semiconductor memory device, comprising the steps of:

forming a resist pattern above a silicon substrate of a first conductivity type;

introducing impurities of a second conductivity type into said silicon substrate with a mask of said resist pattern to form first source regions in said silicon substrate;

removing said resist pattern after formation of said first source regions;

forming a silicon nitride pattern having openings defining field areas covering a part of said first source regions;

performing a heating operation under an oxygen atmosphere upon said silicon substrate with a mask of said silicon nitride pattern to generate a silicon oxide layer in said field areas;

removing said silicon nitride pattern;

forming a first gate insulating layer after removing said silicon nitride layer;

forming a first floating gate electrode layer on said first gate insulating;

forming a second gate insulating layer on said first floating electrode layer;

forming a control gate electrode layer on said second gate insulating layer;

patterning said control gate electrode layer, said second gate insulating layer and said floating gate electrode layer, to form floating gate electrodes and control gate electrodes; and introducing impurities of said second conductivity type into said silicon substrate with a mask of said silicon oxide layer and said control gates electrodes to form second source regions and drain regions, said second source regions being partly superposed on said first source regions.

* * * * *